(12) United States Patent
Gadinski et al.

(10) Patent No.: US 11,325,221 B2
(45) Date of Patent: *May 10, 2022

(54) POLISHING PAD WITH MULTIPURPOSE COMPOSITE WINDOW

(71) Applicant: Rohm and Haas Electronic Materials CMP Holdings, Inc., Newark, DE (US)

(72) Inventors: Matthew R. Gadinski, Newark, DE (US); Mauricio E. Guzman, Bear, DE (US); Nestor A. Vasquez, Middletown, DE (US); Guanhua Hou, Mullica Hill, NJ (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 729 days.

This patent is subject to a terminal disclaimer.

(21) Appl. No.: 16/185,725

(22) Filed: Nov. 9, 2018

(65) Prior Publication Data

US 2019/0232459 A1  Aug. 1, 2019

Related U.S. Application Data

(63) Continuation-in-part of application No. 15/815,121, filed on Nov. 16, 2017, now Pat. No. 10,465,097.

(51) Int. Cl.
*B24D 3/00* (2006.01)
*B24B 37/20* (2012.01)
*B24B 37/24* (2012.01)
*B24D 11/00* (2006.01)
*B24D 18/00* (2006.01)
(Continued)

(52) U.S. Cl.
CPC ............ *B24B 37/205* (2013.01); *B24B 37/24* (2013.01); *H01L 21/30625* (2013.01)

(58) Field of Classification Search
USPC .......................................... 106/293, 298, 299
See application file for complete search history.

(56) References Cited

U.S. PATENT DOCUMENTS 5,913,713 A   6/1999  Cheek et al.
6,040,244 A   3/2000  Arai et al.
(Continued)

FOREIGN PATENT DOCUMENTS

CN         201178090        1/2009

OTHER PUBLICATIONS

Copending U.S. Appl. No. 16/185,643.

*Primary Examiner* — James E McDonough
(74) *Attorney, Agent, or Firm* — Blake T. Biederman (57) ABSTRACT

The invention provides a polishing pad suitable for polishing integrated circuit wafers. It includes an upper polishing layer that having a polishing surface and at least one groove in the upper polishing layer. At least one transparent window is located within the upper layer. The at least one transparent window has a thickness greater than a desired wear depth of the at least one groove. The at least one transparent window includes a non-fluorescent transparent polymer; and a fluorescent transparent polymer. The transparent window allows measuring groove depth by activating the fluorescent transparent polymer with an activation source at a wavelength sufficient to excite the fluorescent transparent polymer and allow endpoint detection by sending light through the fluorescent transparent polymer and the non-fluorescent transparent polymer.

9 Claims, 8 Drawing Sheets

(51) Int. Cl.
    *C09K 3/14*         (2006.01)
    *H01L 21/306*    (2006.01)

(56) References Cited

U.S. PATENT DOCUMENTS

| | | | |
|---|---|---|---|
| 6,090,475 | A | 7/2000 | Robinson et al. |
| 6,106,661 | A * | 8/2000 | Raeder .................... B24B 37/26<br>156/345.12 |
| 9,017,140 | B2 * | 4/2015 | Allison ................. B24B 37/205<br>451/6 |
| 9,138,860 | B2 | 9/2015 | Dhandapani et al. |
| 2013/0237136 | A1 * | 9/2013 | Newell ................ B24D 11/001<br>451/527 |
| 2015/0140691 | A1 * | 5/2015 | Liu ....................... B24B 37/044<br>438/8 |
| 2017/0157733 | A1 | 6/2017 | Shi |

* cited by examiner

POLISHING PAD WITH MULTIPURPOSE COMPOSITE WINDOW

This application is a continuation-in-part of U.S. Ser. No. 15/815,121, filed Nov. 16, 2017, now pending.

BACKGROUND

Chemical Mechanical Planarization (CMP) is a variation of a polishing process that is widely used to flatten, or planarize, the layers of construction of an integrated circuit in order to precisely build multilayer three dimensional circuitry. The layer to be polished is typically a thin film (less than 10,000 Angstroms) that has been deposited on an underlying substrate. The objectives of CMP are to remove excess material on the wafer surface to produce an extremely flat layer of a uniform thickness, said uniformity extending across the entire wafer area. Control of removal rate and the uniformity of removal are of paramount importance.

CMP utilizes a liquid, often called slurry, which contains nano-sized particles. This is fed onto the surface of a rotating multilayer polymer sheet, or pad, which is mounted on a rotating platen. Wafers are mounted into a separate fixture, or carrier, which has a separate means of rotation, and pressed against the surface of the pad under a controlled load. This leads to a high rate of relative motion between the wafer and the polishing pad. Slurry particles trapped at the pad/wafer junction abrade the wafer surface, leading to removal. In order to control rate, prevent hydroplaning, and to efficiently convey slurry under the wafer, various types of texture are incorporated into the upper surface of the polishing pad. Fine scale texture is produced by abrading the pad with an array of fine diamonds. This is done to control and increase removal rate, and is commonly referred to as conditioning. Larger scale grooves of various patterns and dimensions (e.g., XY, circular, radial) are also incorporated for hydrodynamic and slurry transport regulation.

A significant challenge in CMP has been achieving the desired degree of final film thickness and uniformity. Early CMP processes estimated the amount of time required to reach the thickness target based on the removal rates measured on engineering monitor wafers. This did not provide the desired level of control. Accordingly, a variety of in-process film measurement devices have been developed over the past twenty or more years. For CMP of transparent materials, such as $SiO_2$, optical techniques have commonly been employed. A widely used technique is interferometry, which calculates the film thickness from the interference spectrum of light reflected off of the wafer surface. These light sources are generally white light with a wavelength range of 300-800 nm and the reflected light is analyzed via a spectrometer. This allows calculation of film thickness during the CMP process, allowing precise timing for stopping the process. This is often called the endpoint.

Wiring structures in device wafers are constructed by multilayer fabrication of insulator and conductor materials using the damascene process. In this process, a layer of insulator (e.g., $SiO_2$) is deposited, and a pattern of recesses are produced via photolithography and etching. A layer of conductive material (e.g., Cu) is then deposited to completely fill the recesses together with excess material, or overburden, which must be removed to produce an electrically isolated wire structure. This removal is also done using CMP. In this process a selective slurry is used that has a high polishing rate for the metal and a low polishing rate for the insulator phase. A critical part of the CMP process is a precise determination of the point at which the overburden has been completely removed, or cleared. This is important because excessive polishing after the clearing point tends to wear away the remaining wiring metal, producing resistance variation and an uneven surface. A variety of measurement techniques, including, reflectance, have been used. A commonly employed reflectance technique uses an incident laser to illuminate the surface. The degree of reflectance can be calculated from the reflected light. For the case of Cu and $SiO_2$, a sharp reduction in reflectance is observed when the copper overburden has been removed. This is also commonly called the endpoint.

The most widely used method for optical endpointing is to position the measurement equipment under or within the platen beneath the polishing pad. A transparent aperture, or window, is provided in the pad so that reflectance measurements may be taken. These windows may be produced in many different designs, dimensions, and numbers, depending on the specific requirements of the endpointing systems used by the polishing equipment manufacturers. Critical requirements for these windows, regardless of machine specific details, are as follows: (a) sufficient optical transparency to provide adequate signal for a double-pass optical measurement; (b) they must be mechanically strong and firmly bonded to the rest of the polishing pad to avoid leakage; (c) the mechanical properties of the window must be closely matched to the surrounding pad to avoid deformation; and (d) the conditioning wear rate of the window must be closely matched to the surrounding pad to maintain planar contact during the pad's useful lifetime. Typical CMP pads are multilayer structures, which in its simplest form has an upper layer, which contacts the wafer to be polished and contains the window and grooves, a sub-layer of higher compressibility than the top layer, which adjusts compliance and fit to the wafer, and a bottom adhesive layer that holds the pad on to the platen. Generally, the thickness of the window is greater than the groove depth and matches the thickness of the top layer of the pad. The majority of CMP pads produced today have endpointing windows incorporated into them.

The lifetime of a polishing pad is determined by its ability to maintain a constant level of performance set by the device manufacturer. The most common factors limiting pad lifetime are drift in removal rate, and permanent changes in the uniformity of removal across the wafer area. Pad wear is a major root cause of both issues. Diamond conditioning causes wear on the upper pad surface, with a continuous reduction in thickness. As this proceeds, the groove depth continuously decreases. Eventually, the groove cannot maintain the needed hydrodynamic state and the end of pad life is reached. In practice, estimation of pad life is difficult. Mechanical measurement of groove depth requires stopping the polishing machine, which reduces throughput and utilization. The most common techniques used to measure pad wear and changes in groove depth are non-contact surface measurements. Examples of these types of approaches are found in U.S. Pat. No. 6,040,244 (ultrasonic interferometry), and U.S. Pat. No. 9,138,860 (laser or eddy current displacement sensors). While such techniques can measure changes in pad thickness and shape over its entire surface to determine the pad wear rate, commercial systems are very expensive and cannot readily be retrofitted into older polishing machines.

Accordingly, various means of providing pad wear indicators that are built into the pad itself have been developed, which can be used on any polishing machine.

U.S. Pat. No. 5,913,713 disclosed a method for providing a pad wear indicator by producing a series of grooves or cavities in the back side of the upper pad layer. These could be filled with an opaque or high contrast material. As the pad wears, these buried grooves become visible, allowing the operator to call the end of pad life based on the degree of contrast. By using a series of cavities with varying heights, pad wear could be estimated by recording the time to reach each layer. This technique is labor intensive and relatively subjective.

U.S. Pat. No. 6,090,475 disclosed an alternative means of providing a colorimetric pad wear indicator. Colored dyes we applied to the bottom surface of the upper pad layer during manufacturing, which diffused to a predetermined partial depth into the pad. Conditioning wear exposed the dye, giving an indication that pad wear had proceeded to a degree requiring pad replacement. This method is extremely difficult to control, and, furthermore, does not provide a means of measuring the pad wear rate prior to the end of life.

U.S. Pat. No. 6,106,661 disclosed methods for producing a pad wear indicator on the upper pad layer. A series of recesses of varying depths and locations across the pad surface was produced either on the front surface or back surface of the top pad layer and optionally filled with a material of contrasting color. Pad wear by the conditioning process exposed the buried indicator manifested by the appearance of a differently colored spot. Also disclosed was the employment of an unfilled recessed feature or trench on the top surface of the upper pad layer, which would disappear once the pad was worn down to the depth of the recess. In the patent, there was no mention of the incorporation of grooves for hydrodynamic and conveyance control, nor were grooves shown in any of the figures, either for prior art or for invention examples. The wear data was directed toward measuring the overall thinning of the upper pad layer for control of compliance. It did disclose that the technique could provide overall pad wear rates in the same manner as U.S. Pat. No. 5,913,713.

More recently, US Pat. Pub. No. 2017/0157733 disclosed yet another pad wear monitoring technique. A plurality of marker patterns are stacked in locations on the pad that consist of arrays of different patterns varying in design at intervals from the top surface of the upper pad layer to the bottom. As the pad wears, different markers are exposed. This can be combined with a machine vision system to provide status on the progression of wear in the pad.

All of the pad-based approaches cited above have significant deficiencies that have prevented their widespread use. These deficiencies include the following: (1) significant added cost to the polishing pad manufacturing process by their inclusion; (2) interpretation of results is mostly subjective; (3) the approaches are physically intrusive and have the potential to alter the polishing characteristics of the pad; (4) there is no easy means for a user to determine in advance of the exposure of a marker when the pad is approaching a critical wear depth without the addition of multiple markers or expensive additional metrology on the polishing tool; and (5) none of these approaches are compatible with existing endpointing systems used on the majority of polishing pads.

From the above discussion it is clear that if an efficacious pad wear indicator could be developed that could provide continuous wear data without added metrology and was compatible with existing endpoint features already in use, it would be a significant improvement in the state of the art.

STATEMENT OF INVENTION

An aspect of the invention includes a polishing pad suitable for polishing integrated circuit wafers comprising: an upper polishing layer that contacts an article to be polished, the upper polishing layer having a polishing surface; at least one groove in the upper polishing layer, the at least one groove extending downward from the polishing surface of said upper polishing layer, the at least one groove having a depth, at least one transparent window located within the upper layer, the at least one transparent window having a thickness greater than a desired wear depth of the at least one groove, the at least one transparent window including:
a non-fluorescent transparent polymer; and a fluorescent transparent polymer; wherein the transparent window allows measuring groove depth by activating the fluorescent transparent polymer with an activation source at a wavelength sufficient to excite the fluorescent transparent polymer and allows endpoint detection by sending light through the fluorescent transparent polymer and the non-fluorescent transparent polymer.

DETAILED DESCRIPTION OF THE INVENTION

The essential features of the present invention are the use of a composite aperture or window in a multilayer polishing pad to provide the multiple functions of a pad wear indicator and a window that is fully functional for use in an optical endpointing system. This is effected by incorporating two layers into the pad window. One layer is a conventional window material. The second layer is produced using the same polymer as the first layer together with a fluorescent moiety that is part of the polymer structure itself. By adjusting the relative thicknesses of the two layers so that the interface is referenced to the depth of grooves in the pad, the wearing away of the upper layer during pad use can be employed as a groove wear indicator.

Figure 1:
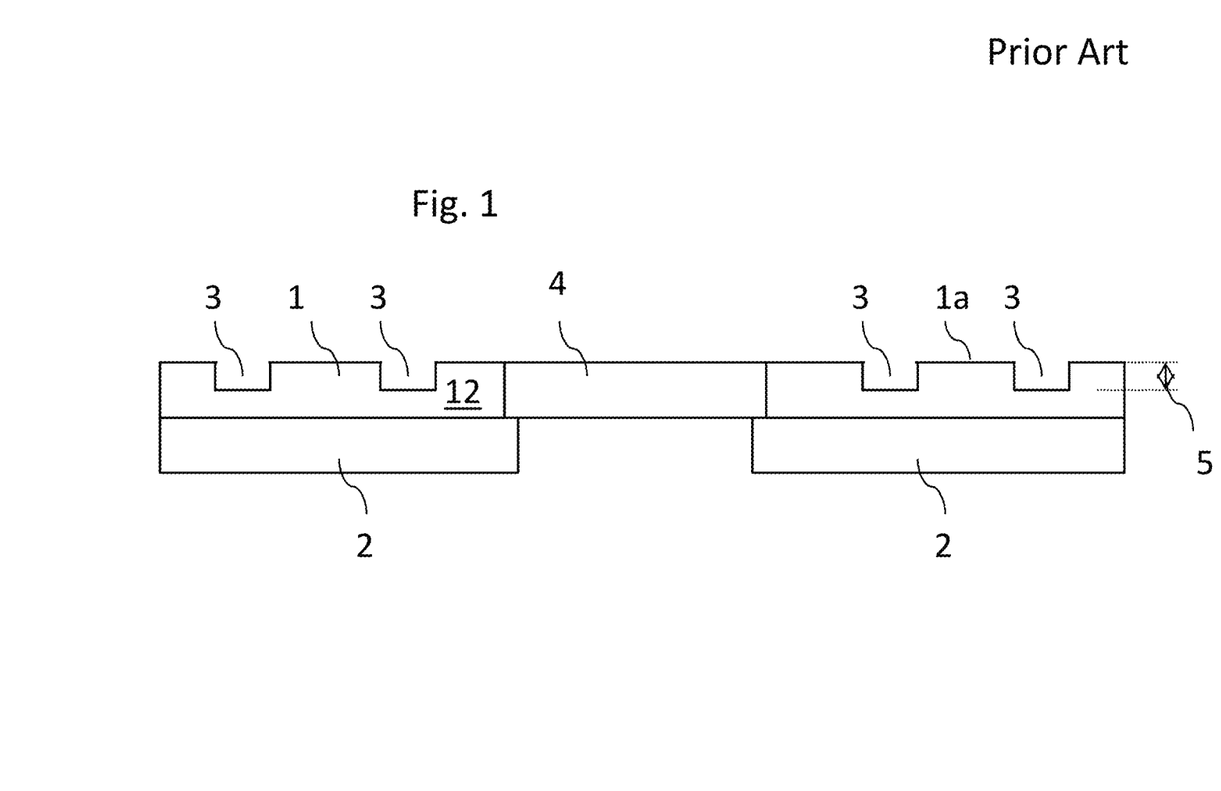
FIG. 1 is a schematic drawing of a conventional window in a CMP polishing pad for use in wafer endpoint detection.

Referring to FIG. 1, prior art CMP polishing pads (12) consist of a multi-level composite comprising an upper or top pad layer (1) and a lower pad layer (2). The upper pad layer (1) has a polishing surface (1a). The polishing surface (1a) is the surface that contacts the substrate to be polished. The polishing layer (1) has a series of grooves (3) that have a depth (5) that are less than the total thickness of the upper pad layer (1). The polishing surface (1a) also has a single component polymeric optical endpoint window (4) whose top surface is coplanar with the polishing surface (1a) of the upper pad layer (1) and a total thickness equal to that of the upper pad layer (1). FIGS. 1 to 4 include the same component identifications.

Figure 2:
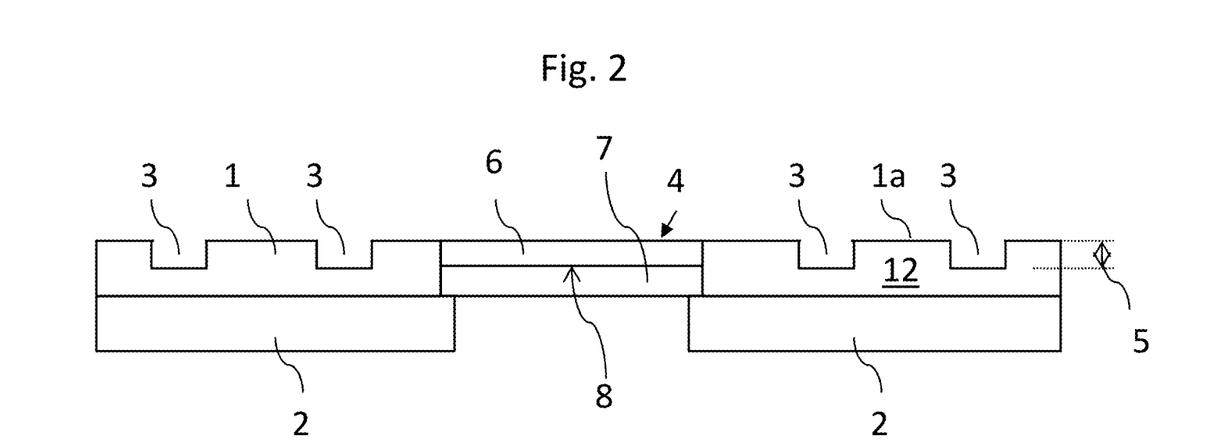
FIG. 2 is a schematic drawing of a fluorescent window in a CMP polishing pad for use in wafer endpoint detection.

Referring to FIG. 2, the window of a conventional pad (4) has been replaced by a composite polymer window (4) having two layers (6) and (7) that are placed in the same plane as the upper or top pad surface (1). Optionally, the two layers (6) may have a height just below the surface of the polishing surface (1a). The boundary interface (8) between the upper window layer (6) and the lower window layer (7) is situated on a plane parallel to polishing surface (1a), whose distance from the polishing surface (1a) is slightly less than the recess depth (5) of the pad grooves (6). In this embodiment, the top window layer (6) has fluorescent properties, i.e., it emits light when illuminated with ultraviolet radiation. The lower layer (7) is a non-fluorescent polymer of composition identical to the fluorescent layer (6), except that the fluorescent polymer is absent. When the pad (12) is mounted into the polishing machine, illumination of the upper surface of the pad will produce a fluorescent light emission arising from the area of the window. As the pad is used to polish integrated circuit wafers and conditioned, pad wear occurs over all of the upper features, including the upper window layer (6). Over time, there is a continuous reduction in the upper pad layer (1) as well as the upper window layer (6). Eventually the depth of wear is sufficient to completely remove the upper window layer (6). At this point, exposure of the pad to ultraviolet radiation produces no fluorescence. This loss of fluorescent response signals that the pad has reached the end of its useful life and should be replaced. It is appreciated that the composite polymer window boundary interface (8) can be adjusted relative to any depth of wear desired. Advantageously, the boundary interface has an end location of less than or equivalent to the depth of the at least one groove. For example, if a user wishes to call end of pad life at 80% removal of the groove depth (5), the interface of the composite window can be set accordingly.

Advantageously, the upper layer (1) and the upper window layer (6) wear at the same rate during diamond conditioning. This embodiment of the invention does not provide an accurate means of indicating the progression of pad wear. As the upper window layer (6) becomes thinner, the total fluorescence is not expected to diminish in a proportional manner, especially if the UV illumination wavelength is below the minimum transparency wavelength of the layer.

Alternatively, it is possible to reverse the fluorescence and non-fluorescence of layers (6) and (7). In this embodiment, the arrival of fluorescent light indicates the end of pad life.

Figure 3:
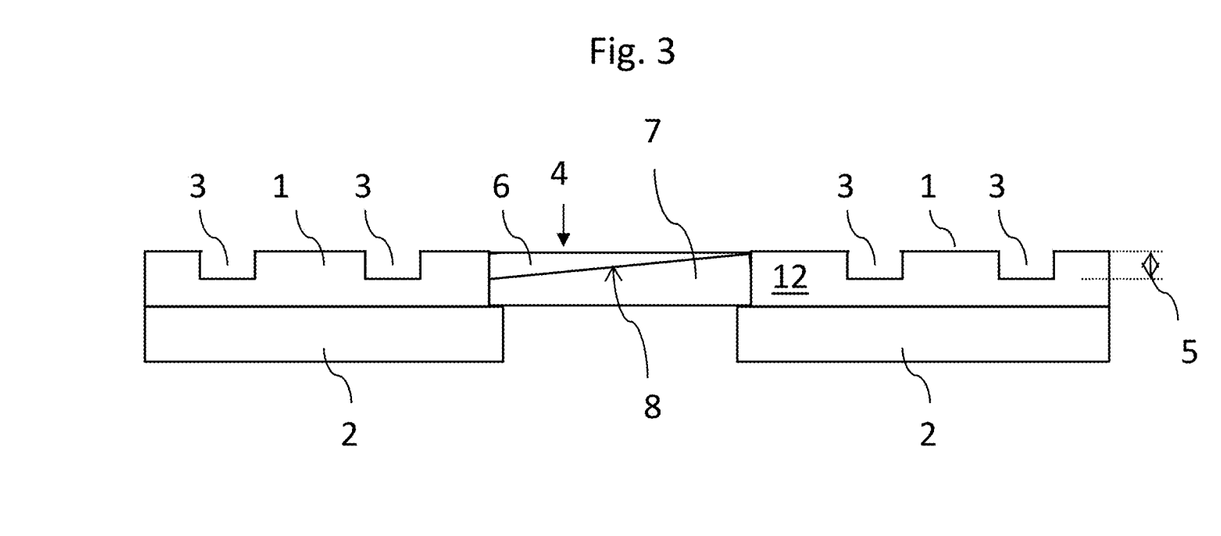
FIG. 3 is a schematic drawing of a fluorescent window in a CMP polishing pad for providing a combination of continuous pad polishing pad wear detection and wafer endpoint detection having an angled boundary interface.

FIG. 3 is to an embodiment for continuously determining wear of the upper layer (1). This fluorescent composite window (4) employs a sloped boundary interface (8) below the upper and lower window layers. The slope is at an angle to the top plane of the upper pad layer (1) and polishing layer (1a). In this embodiment, the angle of the interface is adjusted such that the thickest part of the upper window layer (6) is at a depth below the upper pad layer (1) surface that it is equivalent to the groove depth (5). At the opposite side of the composite window, the boundary interface (8) is at the upper surface of the pad (12). When viewed from above under ultraviolet illumination, the entire area of the composite window fluoresces, as shown in FIG. 4A.

As the pad is used, and wear begins, the location of the composite polymer wafer interface at the upper surface shifts away from the edge of the composite window as a portion of the lower composite window layer (7) is exposed. Since less area of the composite window top layer (6) exists, the amount of fluorescence observed under ultraviolet illumination is reduced accordingly. As wear continues, the percentage of the lower composite window layer (7) that is exposed increases directly with the amount of wear, and the fluorescent area of the window decreases directly until the depth of pad wear is equivalent to the groove depth (3).

Figure 3A:
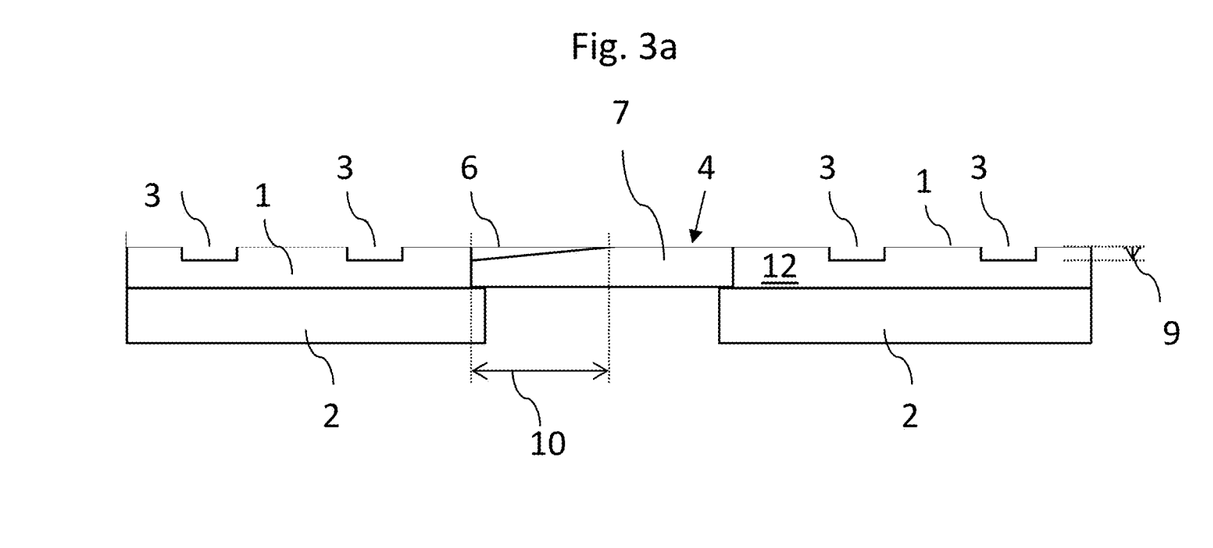
FIG. 3A is the schematic drawing of FIG. 3 with half of the groove depth remaining.
Figure 3B:
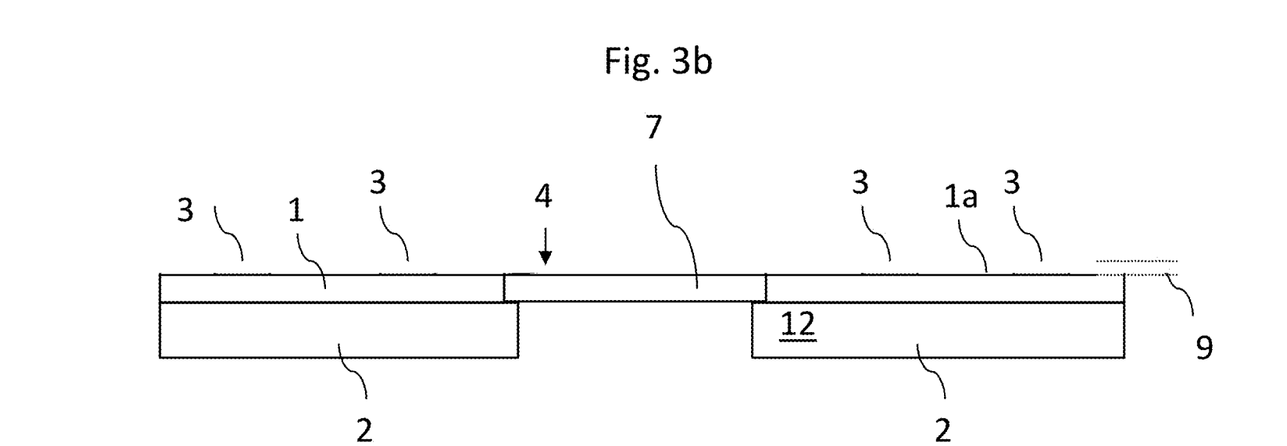
FIG. 3B is the schematic drawing of FIG. 3 with none of the groove depth remaining.
Figure 4:
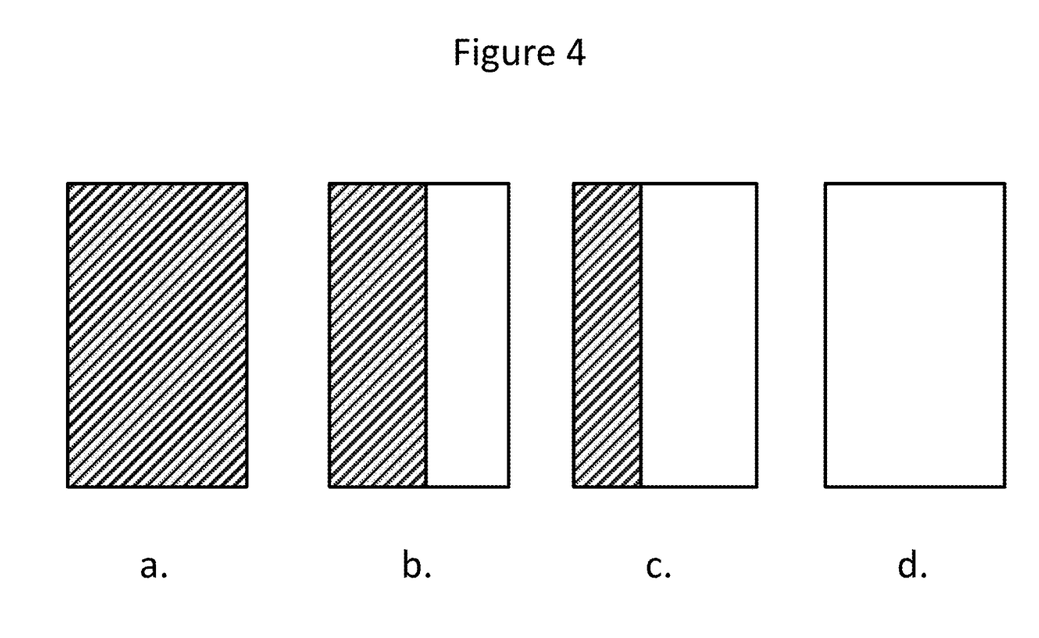
FIGS. 4A to 4D illustrate the change in fluorescent image seen from above the pad of FIG. 3 when it is illuminated with ultraviolet radiation with the cross hatching indicating the presence of fluorescence.

FIG. 3A illustrates window (4) worn down until grooves (3) have depth (9). At this point, the width (10) of top window layer (6), reduces to 50% of its original width. Referring to FIG. 3B, at this point, the grooves (3) have worn down their remaining groove depth (9). Thus, there is no fluorescence produced when the pad is illuminated with ultraviolet radiation. Since the width of the fluorescing portion of the window is correlated to the amount of pad wear relative to the groove depth, the user of such a pad can immediately and quantitatively determine the extent of groove wear simply by observing the pad under ultraviolet illumination. Moreover, the change in the width of the fluorescent image over time can be used to precisely calculate the wear rate of the pad.

Most advantageously, the upper layer (1) and the upper window layer (6) wear at the same rate; and the fluorescent top layer (6) and non-fluorescent lower composite layer (7) also wear at the same rate. The boundary interface (8) most advantageously has a location of less than or equivalent to the depth of the at least one groove. Optionally, the two layers (6) and (7) may have a height just below the surface of the polishing surface (1a). When the height is less than that of the pad top layer surface (1), there is a polishing lag time before the fluorescent signal begins to change with pad wear.

FIGS. 4A to 4D illustrate the change in fluorescent with wear of the polishing pad (12) of FIG. 3. FIG. 4A represents the fluorescent image of the pad as produced. The entire area of the composite window fluoresces. FIG. 4B represents the fluorescent image of the composite window at the point when 50% of the groove depth has been removed by wear. Only 50% of the area of the composite window is fluorescent. FIG. 4C represents the fluorescent image of the composite window when 75% of the groove depth has been removed. Only 25% of the area of the composite window is fluorescent. FIG. 4D represents the fluorescent image of the composite window when the wear depth is equivalent or greater than the desired groove finishing depth. No fluorescence is observed. Advantageously, the boundary interface has an end location of less than or equivalent to the depth of the at least one groove. The end location can be at any location along the path from 4A to 4D. Most advantageously, the end location is at location 4D where no fluorescent light signal exists.

Alternatively, it is possible to reverse the fluorescence and non-fluorescence of layers (6) and (7). Then the increase of fluorescent light indicates polishing pad wear and ultimately the end of polishing pad life. The composite widow geometry can be easily modified to fit any desired groove depth, or desired pad wear depth at which to call end of life for the pad. The overall shape and dimensions of the composite window of the current invention may be adjusted to conform with any optical endpointing system (e.g., rectangular, circular, single window or multiple windows) so long as it includes the sloped boundary interface (8). It is also appreciated that methods other than visual observation can be employed to detect and quantify the fluorescent response. These include machine vision systems, spectrophotometric detection and analysis systems, and modification of existing optical endpointing systems.

The other critical feature of all embodiments of the invention is that the composite window can serve dual purposes. Besides the fluorescent effect used to monitor pad wear, the composite window is designed to function as a conventional window for existing optical endpointing systems. This compatibility is effected by using the same or equivalent base polymers as are currently used, and ensuring that the composite window has mechanical properties and conditioning wear rates that are matched to the upper pad layer (1) that the composite window is being used with. Thus, for instances in which the pad of the present invention is being used solely without concern for wear rates but requires an optical endpoint capability, it is fully suitable. Likewise, for use in polishers without endpointing capability, the composite window structure can be used for pad wear monitoring. As will be appreciated by those skilled in the art, a wide variety of polymers may be used for construction of composite windows of the invention, and specific illustrative examples shown here are not meant to be limiting in any way, as long as the final material properties meet requirements.

Compatibility of the composite window of the present invention with optical endpointing systems requires that the potential for fluorescence produces no errors or untoward effects on the optical endpointing system itself. Since current optical endpointing systems use sources and detectors from 300 nm to more than 1000 nm, the transparency of the composite window must extend over a range corresponding to the wavelength of light used for the optical endpointing apparatus. Accordingly, the excitation wavelength for the fluorescence that is produced in the fluorescent layer of the composite window must be significantly below the wavelength of light used for the optical endpointing apparatus, so that both layers of the composite window of the invention have a net transparency that permits use of the optical endpointing systems.

For compatibility with optical endpointing systems using a HeNe wavelength (632.8 nm) for measurement, a wide variety of fluorescent species may be employed. An illustrative example of a useful moiety are fluorescein-containing compounds (excitation wavelength ~470 nm and emission wavelength ~511 nm). This particular species is convenient, as the emission spectrum does not interfere with the laser used for endpointing purposes.

For white light systems, transparency must extend to 400 nm. This requires use of fluorescent species in the fluorescent layer of the composite window to have an excitation wavelength below ~350 nm in order to provide the required high optical transmission at 400 nm. This limits the number of fluorescent species to those containing conjugated aromatic groups such as anthracenyl-, pyrenyl- and naphyl-containing compounds. These moeities all have excitation wavelengths in the UV and emission wavelengths near the lower transmission limit of the lowest wavelength used in the detection system.

For compatibility with endpointing systems utilizing light sources in the near ultraviolet, the lower transmission window for the window shifts to a cut-off wavelength of ~300 nm. This further restricts the fluorescent species to naphthyl-containing species.

An additional consideration in the use of fluorescent species in the articles of the current invention is that they should not leach out of the window during use, or be reactive to slurry components. Accordingly, the ideal approach is to incorporate the fluorescent species into the polymer structure. The most suitable means of effecting this is to utilize a urethane/acrylate copolymer containing a UV curable linking group as the base indicator composition. Advantageous examples of UV curable linking group moieties include acrylate, methacrylate and acrylamide linking groups. Advantageously, the fluorescent moiety is chemically linked to the transparent UV curable polymer. By addition of fluorescent acrylate monomers into the polymerization process, one can produce structurally bound polymers containing the desired fluorescent species in a wide range of concentrations. More importantly, addition of the fluorescent monomer can be made as a partial substitution for other acrylate monomers used in the synthesis. This allows production of the fluorescent polymer with the same physical and mechanical properties as the un-doped parent, which is preferred for producing a well-matched composite window.

Fluorescent monomers are commercially available with a wide variety of fluorophores. Fluorescent monomers of particular use in this invention are; 9-anthracenyl methyl methacrylate (excitation wavelength 362 nnm, emission wavelength 407 nm), 1-pyrenyl methyl methacrylate (excitation wavelength 339 nm, emission wavelength 394 nm), 2-naphthyl acrylate (excitation wavelength 285 nm, emission wavelength 345 nm), and 2-naphthyl methacrylate (excitation wavelength 285 nm, emission wavelength 345 nm). Most advantageously, the fluorescent transparent polymer includes at least one fluorescent moiety selected from 2-naphthyl acrylate; 9-anthracenyl methyl methacrylate; and 1-pyrenyl methyl methacrylate.

Production of the composite windows of the present invention can be prepared via a number of techniques including, but not limited to, casting, preparation, and bonding of two separate layers, and, preferably, casting a layer of the uncured fluorescent polymer on top of a cured sheet of the cured non-fluorescent polymer, and curing the cast composite to produce a two layer body. This produces a composite sheet with very high interfacial strength that is free from defects. A simple and cost-effective means of preparing the final composite windows having variable angular differences between the interface plane and the physical plane of the entire composite window is to first produce a planar composite sheet, cutting the sheet into blanks, and machining the top and bottom surfaces to achieve the desired boundary interface angle and final window dimensions, such as shown in FIG. 3.

Following production of the finished composite window, it may be incorporated into the final polishing pad. Final assembly can be effected by numerous means, including, but not limited to, inserting a window into an aperture in the top pad layer and cementing it in place, ultrasonic welding, or casting the top pad layer around the window via techniques such as injection molding or compression molding to produce a single net shaped top pad layer, with the composite window cast in place.

Example

Three samples were made to assess the effects of base polymer and effect of the fluorescent species concentration on properties and performance. For Samples 1a and 1b, 55.8 g of Voranol™ 220-110 multi-functional polyol was mixed with 4,4'-Methylene dicyclohexyl diisocyanate ($H_{12}MDI$), heated to 80° C. and held for 4 hours to make the base prepolymer. For Sample 2, Adiprene™ L325 polyurethane prepolymer was used as received. To the above synthesized and commercial prepolymers 37 g of hydroxyethyl methacrylate was added, mixed, and held at 80° C. for 12 hours. This produced the acrylate end-capped polyurethane samples. For the purposes of this specification, urethane polymers include urethanes, ureas and blends of urethanes and ureas. To make these fluorescent 0.0137 g (100 ppm) of 2-napthyl acrylate monomer was added to Sample 1a and Sample 2, and 0.137 g (1000 ppm) was added to Sample 1b. To each of these formulation 0.1 wt % of camphorquinone UV initiator and 0.2 wt % N-methyldiethanolamine as co-initiator was added and dissolved. These mixtures were then individually poured and sandwiched between two glass plates and exposed to UV light via halogen bulb for 5 minutes.

Mechanical properties of the samples in comparison to the pad in which the window will be used (VP5000) are shown in Table 1. The properties of Sample 1 was found to match that of a filled hard pad closely, except for elongation. With these properties they wear rates should remain comparable.

TABLE 1

Mechanical properties of UV curable formulations and comparison materials.

| Pad Sample | Hardness (Shore D) | G' 30° C. (MPa) | G' 40° C. (MPa) | Tensile Strength, (MPa) | Elongation (%) | Tensile Modulus (MPa) |
|---|---|---|---|---|---|---|
| Sample 1 | 58.9 | 104 | 75 | 13.1 | 6 | 290 |
| Sample 2 | 64.9 | 129 | 79 | 26.5 | 33 | 383 |
| Filled VP5000 | 61.8 | 157 | 125 | 29.3 | 229 | 269 |

Figure 5:
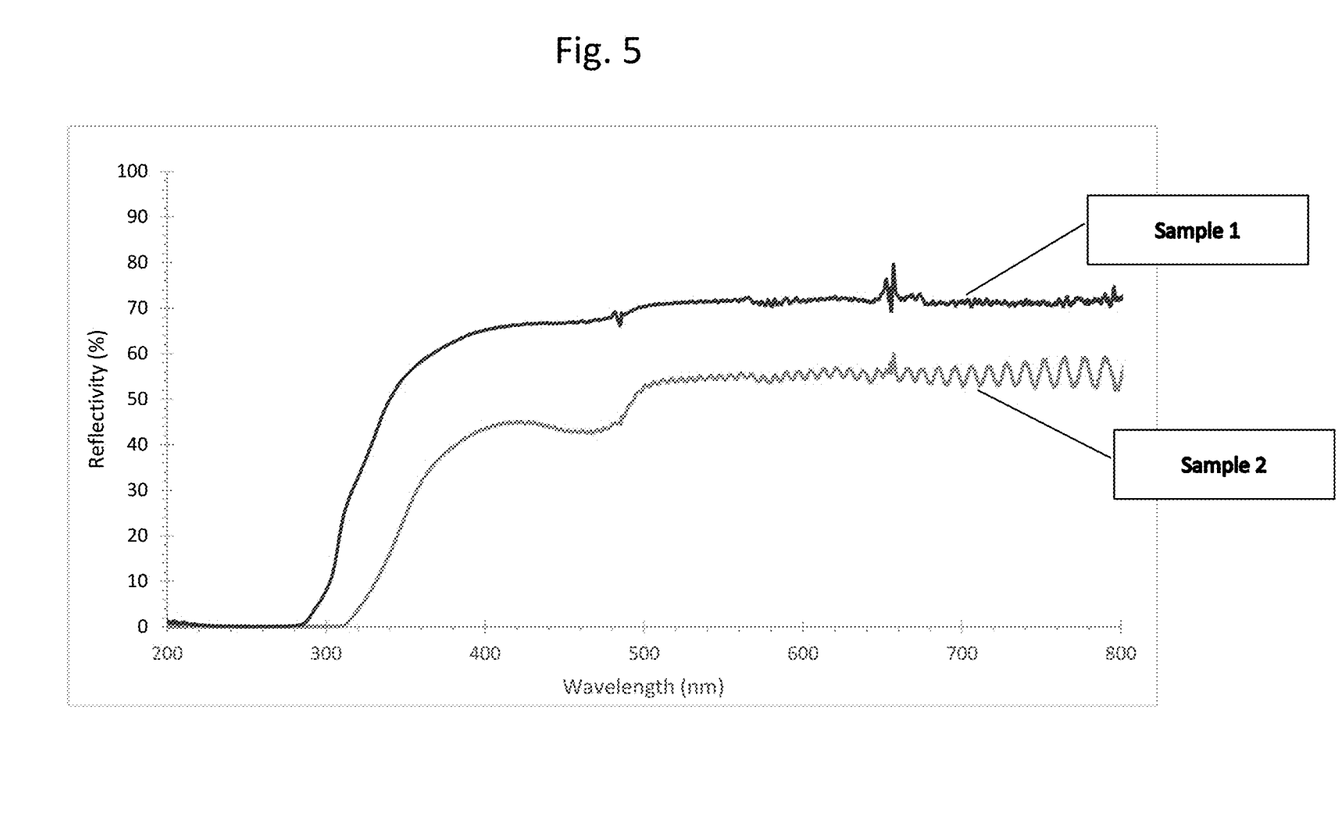
FIG. 5 plots the transmission spectrum of the parent polymers described in Example 1.

The transmission spectrum of the undoped parent polymer windows is shown in FIG. 5. Sample 1 (without fluorescent monomer) demonstrates acceptable transmission down to 300 nm. Sample 2 does not and should show limited fluorescence when incorporated into that formulation. Additionally, Sample 2 has limited transmission wavelength ranges used in optical endpointing, which makes its use in the present invention undesirable.

Figure 6:
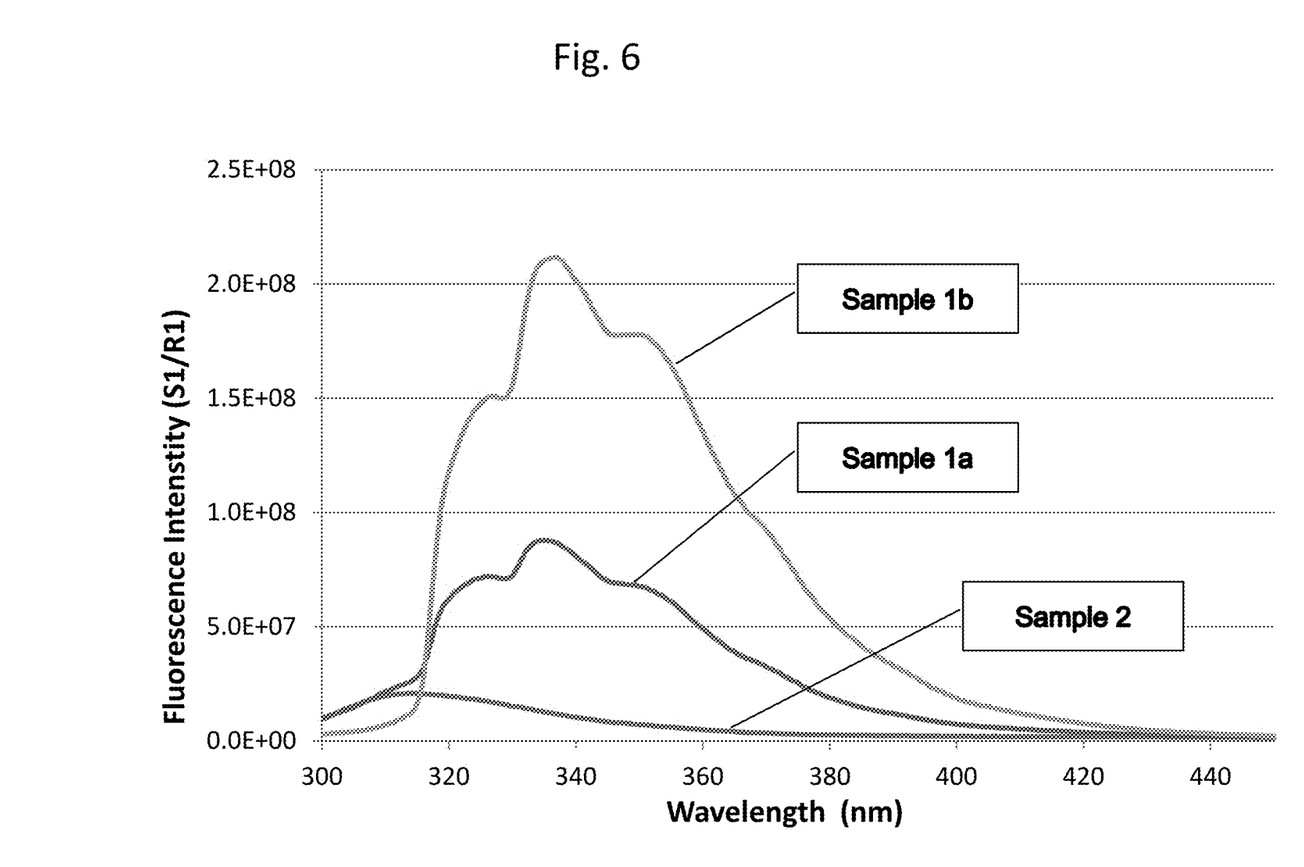
FIG. 6 plots the fluorescence spectra of fluorescent polymers described in Example 1.

The fluorescence spectrum of the doped polymer windows is shown in FIG. 6. As expected, Sample 1a exhibits limited fluorescence, as the UV light cannot transmit through the material and cannot excite the 2-naphthyl acrylate linked into the polymer structure. Sample 1a with the same level of 2-naphthyl acrylate doping shows a significant peak at 345 nm that is the reported emission wavelength of 2-naphthyl acrylate. Sample 1b with an order of magnitude increase in fluorescent monomer content shows that fluorescence can be increased by increasing fluorescent monomer doping. It should be noted that while the primary fluorescence intensity is below the limit of human vision (380 nm), the broad emission spectrum allows human observation of the fluorescence as a violet color.

In summary, the invention provides a combination of pad wear and endpoint detection in a single transparent polymeric window. This invention allows both pad and groove wear without the need to retrofit tools with expensive hardware solutions. Finally, the use of an angled boundary interface can function analogous to a gas gauge to monitor polishing pad wear rate and groove life.

We claim:

1. A polishing pad suitable for polishing integrated circuit wafers comprising:
an upper polishing layer that contacts an article to be polished, the upper polishing layer having a polishing surface;
at least one groove in the upper polishing layer, the at least one groove extending downward from the polishing surface of said upper polishing layer, the at least one groove having a depth,
at least one transparent window located within the upper layer, the at least one transparent window having a thickness greater than a desired wear depth of the at least one groove, the at least one transparent window including:
a non-fluorescent transparent polymer; and
a fluorescent transparent polymer; wherein the transparent window allows measuring groove depth by activating the fluorescent transparent polymer with an activation source at a wavelength sufficient to excite the fluorescent transparent polymer and allows endpoint detection by sending light through the fluorescent transparent polymer and the non-fluorescent transparent polymer.

2. The polishing pad of claim 1 wherein a boundary interface separates the non-fluorescent transparent polymer from the fluorescent transparent polymer.

3. The polishing pad of claim 2 wherein the boundary interface is parallel to the polishing surface of the polishing pad.

4. The polishing pad of claim 2 wherein the boundary interface is at an angle to the polishing surface of the polishing pad for continuous determination of pad wear.

5. The polishing pad of claim 2 wherein the boundary interface has an end location of less than or equivalent to the depth of the at least one groove.

6. The polishing pad of claim 1 wherein the fluorescent transparent polymer includes a fluorescent moiety and the fluorescent moiety is chemically linked to a transparent polymer.

7. The polishing pad of claim 1 wherein the fluorescent moiety contains an acrylate linking group.

8. The polishing pad of claim 1 wherein the fluorescent moiety contains a methacrylate linking group.

9. A polishing pad of claim 1 wherein the fluorescent transparent polymer wears at a rate equal to the non-fluorescent transparent polymer and the fluorescent transparent polymer includes at least one fluorescent moiety selected from 2-naphthyl acrylate; 9-anthracenyl methyl methacrylate; and 1-pyrenyl methyl methacrylate.

* * * * *